(12) United States Patent
Lee et al.

(10) Patent No.: US 10,217,969 B2
(45) Date of Patent: Feb. 26, 2019

(54) ORGANIC LIGHT EMITTING DIODE DISPLAY AND METHOD FOR FABRICATING THE SAME

(71) Applicant: LG DISPLAY CO., LTD., Seoul (KR)

(72) Inventors: Heui-Dong Lee, Paju-si (KR); Kwang-Yeon Lee, Paju-si (KR); Sang-Dae Kim, Paju-si (KR); Dae-Gwon Song, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 14/106,147

(22) Filed: Dec. 13, 2013

(65) Prior Publication Data

US 2014/0167013 A1 Jun. 19, 2014

(30) Foreign Application Priority Data

Dec. 14, 2012 (KR) .................. 10-2012-0146433

(51) Int. Cl.
| | |
|---|---|
| *H01L 35/24* | (2006.01) |
| *H01L 51/56* | (2006.01) |
| *H01L 51/52* | (2006.01) |
| *H01L 51/00* | (2006.01) |
| *H01L 27/32* | (2006.01) |

(52) U.S. Cl.
CPC .......... *H01L 51/56* (2013.01); *H01L 51/5265* (2013.01); *H01L 27/3216* (2013.01); *H01L 51/0037* (2013.01); *H01L 51/0085* (2013.01); *H01L 2251/558* (2013.01)

(58) Field of Classification Search
CPC ............. H01L 51/5265; H01L 27/3216; H01L 51/0037; H01L 51/0085
See application file for complete search history.

(56) References Cited

U.S. PATENT DOCUMENTS

| | | | | |
|---|---|---|---|---|
| 2011/0170169 A1* | 7/2011 | Komatsu | ................. | G02F 1/167 359/296 |
| 2011/0241000 A1* | 10/2011 | Choi | ................... | H01L 51/5265 257/59 |

(Continued)

FOREIGN PATENT DOCUMENTS

| | | |
|---|---|---|
| CN | 102270655 A | 12/2011 |
| CN | 101882666 B | 3/2012 |

(Continued)

*Primary Examiner* — Samuel A Gebremariam
(74) *Attorney, Agent, or Firm* — Dentons US LLP

(57) ABSTRACT

Disclosed are an organic light emitting diode display device and a method for fabricating the same. The OLED display device includes first and second electrodes formed on a substrate, a red light-emitting layer, a green light-emitting layer and a blue light-emitting layer formed between the first and second electrodes, a hole transport layer formed between each of the red light-emitting layer, the green light-emitting layer and the blue light-emitting layer, and the first electrode, an electron transport layer formed between each of the red light-emitting layer, the green light-emitting layer and the blue light-emitting layer, and the second electrode, and a conducting polymer formed between the substrate and the first electrode, the conducting polymer having different thicknesses in regions respectively corresponding to the red light-emitting layer, the green light-emitting layer and the blue light-emitting layer.

4 Claims, 11 Drawing Sheets

(56) References Cited

U.S. PATENT DOCUMENTS

| | | | | |
|---|---|---|---|---|
| 2011/0297977 A1* | 12/2011 | Kajimoto | ............ | H01L 27/3206 257/89 |
| 2012/0161115 A1* | 6/2012 | Yamazaki | ........... | H01L 51/5212 257/40 |
| 2012/0256208 A1* | 10/2012 | Hatano | ................ | H01L 51/504 257/89 |

FOREIGN PATENT DOCUMENTS

| | | |
|---|---|---|
| CN | 102474938 A | 5/2012 |
| CN | 101944437 B | 12/2012 |
| JP | 2010-056017 A | 3/2010 |
| KR | 10-2009-0003590 A | 1/2009 |
| KR | 10-2012-0100813 A | 9/2012 |
| TW | 201241745 A1 | 10/2012 |

* cited by examiner

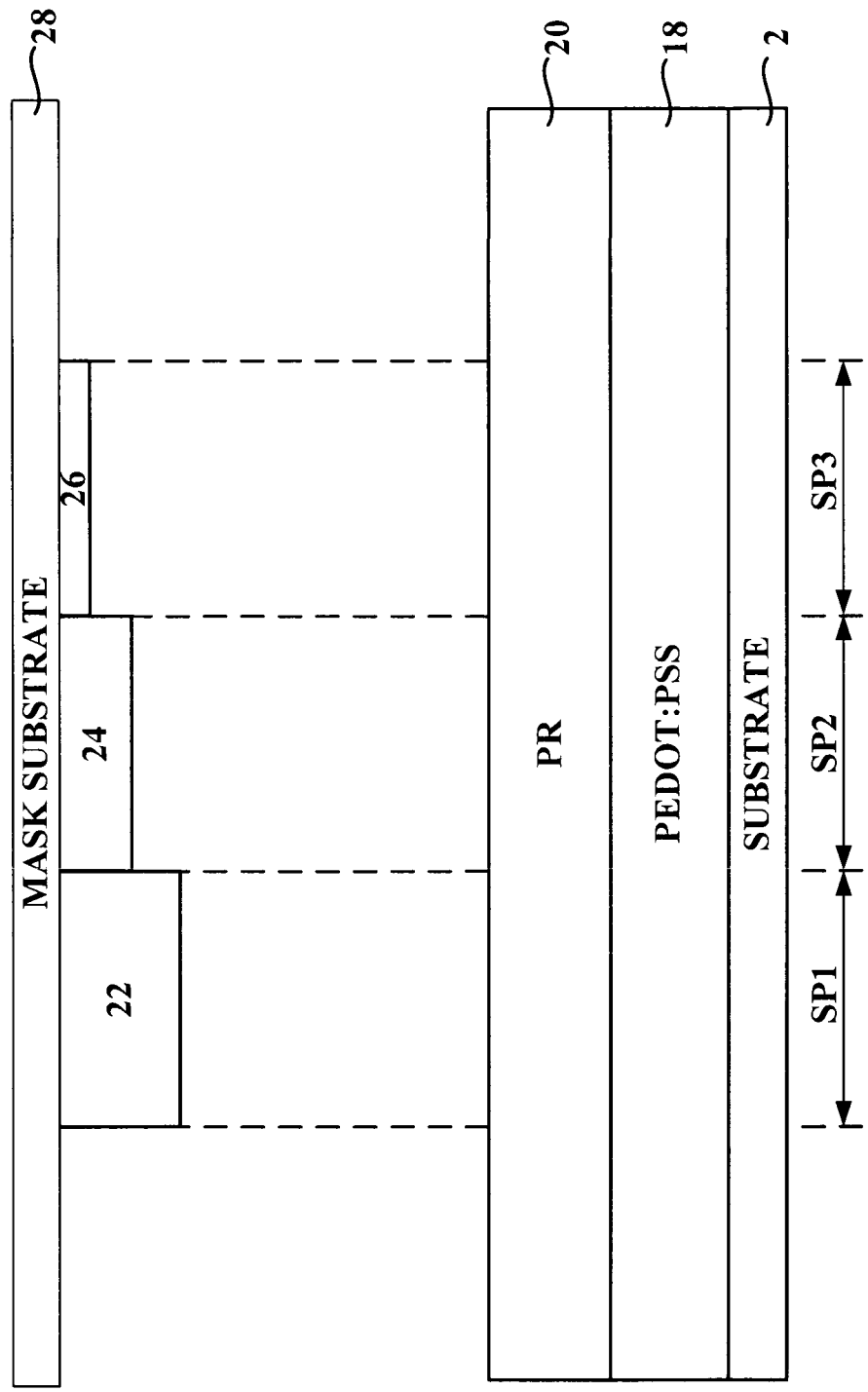

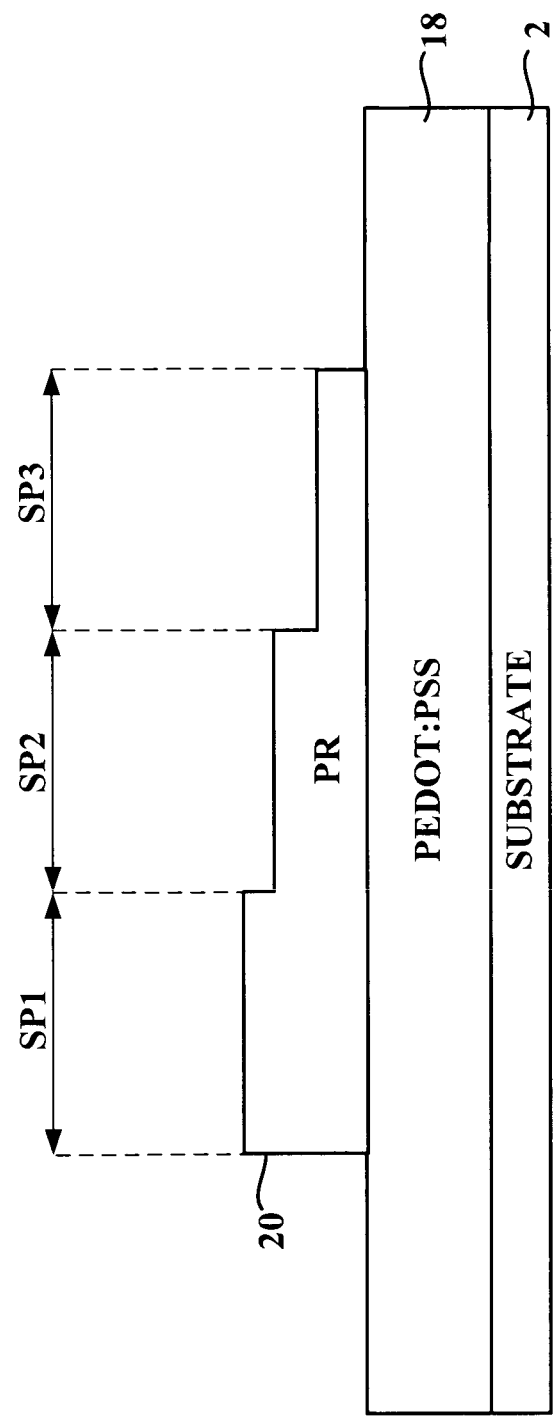

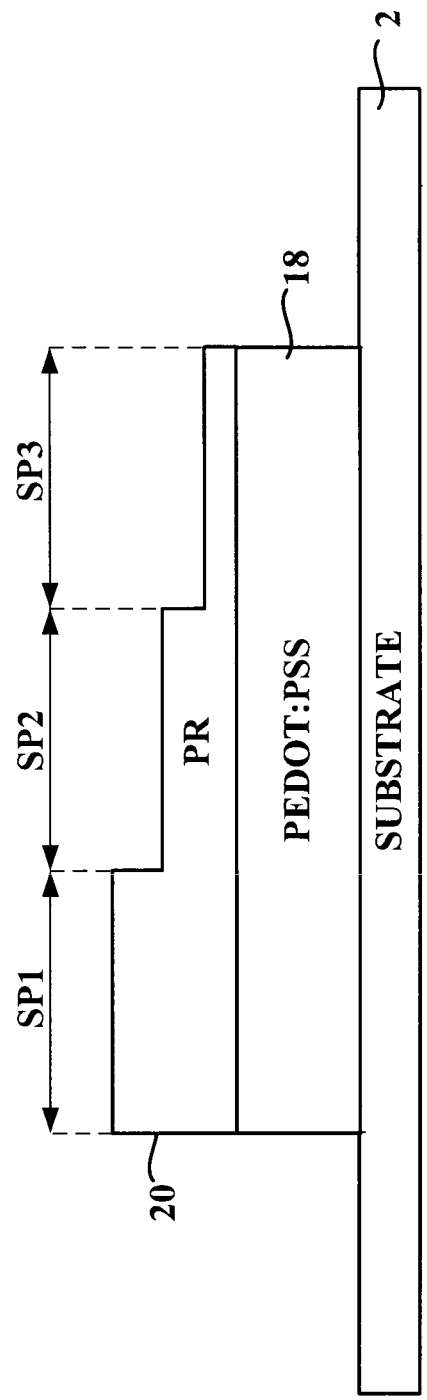

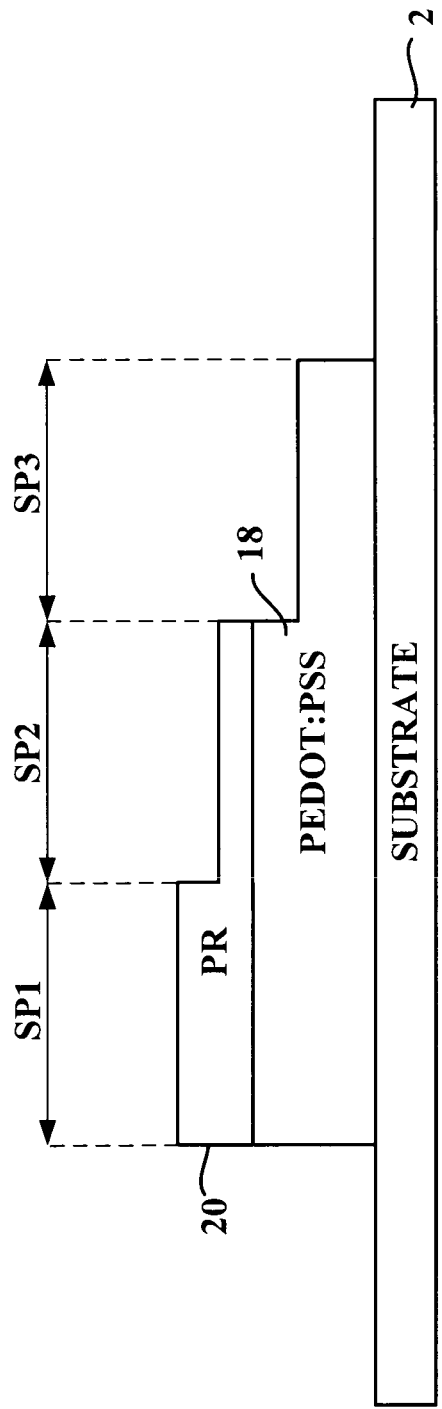

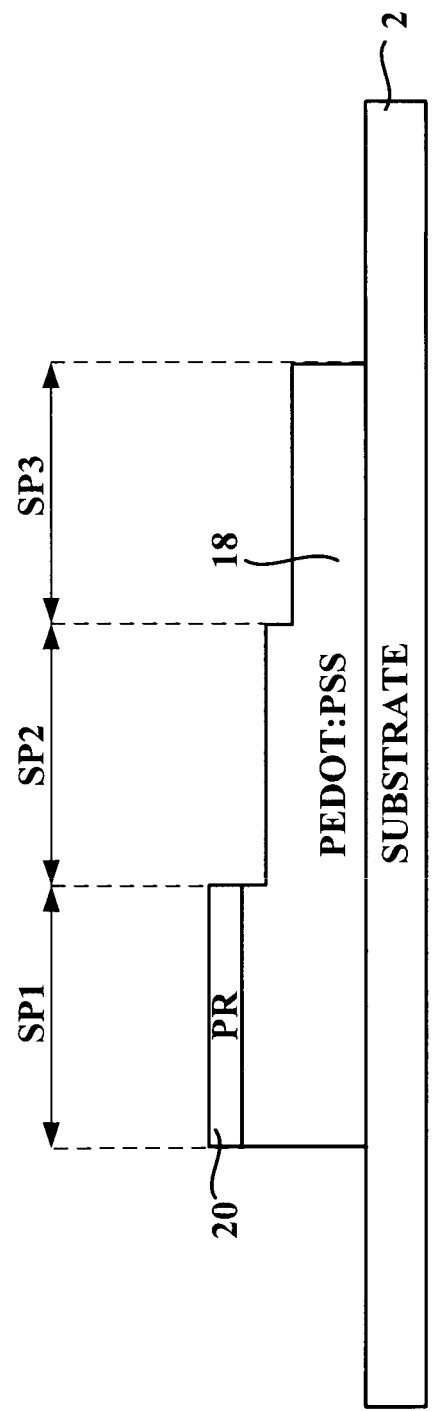

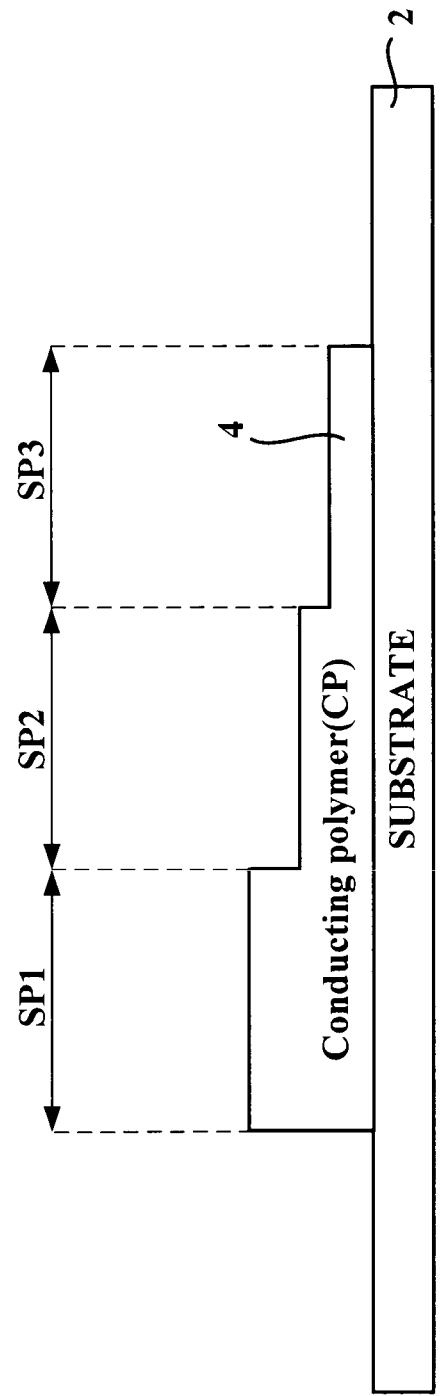

ORGANIC LIGHT EMITTING DIODE DISPLAY AND METHOD FOR FABRICATING THE SAME

CROSS-REFERENCE TO RELATED APPLICATIONS

This application claims the benefit of Korean Patent Application No. 10-2012-0146433, filed on Dec. 14, 2012, which is incorporated by reference for all purposes as if fully set forth herein.

BACKGROUND OF THE INVENTION

Field of the Invention

The present invention relates to an organic light emitting diode (hereinafter, referred to as an "OLED") display device and a method for fabricating the same.

Discussion of the Related Art

In recent years, OLED display devices are attracting considerable attention as flat panel display devices, which solve high weight and high volume, issues that are problems of cathode ray tubes (CRTs). Such an OLED display device includes an anode, a cathode, and an organic semiconductor layer formed between the anode and the cathode. The organic semiconductor layer includes a hole injection layer, a hole transport layer, a light-emitting layer, an electron transport layer and an electron injection layer.

Meanwhile, microcavity technology is one method of improving color purity and brightness of OLED displays. Microcavity technology is an optical technology which employs microcavity effect wherein light emitted from the light-emitting layer mutually interferes between a complete-reflection surface and a semi-reflection surface. For this purpose, a conventional OLED display device is designed to have hole transport layers having different thicknesses in respective RGB sub-pixels. In this regard, hole transport layers for controlling thickness, which are separately stacked in order to control the thickness of hole transport layers in respective RGB sub-pixels, are produced at a high raw material cost, and remain on ribs of shadow masks and are bonded thereto upon formation of films due to material properties, thus causing a defect in which openings of shadow masks are clogged.

SUMMARY OF THE INVENTION

Accordingly, the present invention is directed to an organic light emitting diode display device and a method for fabricating the same that substantially obviate one or more problems due to limitations and disadvantages of the related art.

An object of the present invention is to provide an OLED display device and a method for fabricating the same to prevent a defect in which openings of shadow masks are clogged.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an OLED display device comprising first and second electrodes formed on a substrate, a red light-emitting layer, a green light-emitting layer and a blue light-emitting layer formed between the first and second electrodes, a hole transport layer formed between each of the red light-emitting layer, the green light-emitting layer and the blue light-emitting layer, and the first electrode, an electron transport layer formed between each of the red light-emitting layer, the green light-emitting layer and the blue light-emitting layer, and the second electrode, and a conducting polymer formed between the substrate and the first electrode, the conducting polymer having different thicknesses in regions respectively corresponding to the red light-emitting layer, the green light-emitting layer and the blue light-emitting layer. the thickness of the conducting polymer decreases in an order of the region corresponding to the red light-emitting layer, the region corresponding to the green light-emitting layer and the region corresponding to the blue light-emitting layer.

The conducting polymer may be formed only in the region corresponding to the red light-emitting layer and the region corresponding to the green light-emitting layer, and the thickness of the conducting polymer may decrease in an order of the region corresponding to the red light-emitting layer and the region corresponding to the green light-emitting layer.

The thickness of the conducting polymer may be 20 nm to 200 nm.

The conducting polymer may have a refractive index of 1.5 to 2.0 and a transmittance of 90% or more in a visible light region.

The conducting polymer may be formed of a material selected from a conductive plastic (PEDOT-PSS), polyacetylene, polyparaphenylene, polypyrrole and polyaniline.

In accordance with another aspect of the present invention, there is provided a method for fabricating an OLED display device comprising forming a conducting polymer on a substrate, forming a first electrode on the conducting polymer, forming a hole transport layer on the first electrode, forming a red light-emitting layer, a green light-emitting layer and a blue light-emitting layer on the hole transport layer, forming an electron transport layer on the red light-emitting layer, the green light-emitting layer and the blue light-emitting layer, and forming a second electrode on the electron transport layer, wherein the conducting polymer has different thicknesses in regions respectively corresponding to the red light-emitting layer, the green light-emitting layer and the blue light-emitting layer.

The conducting polymer may be formed by a half-tone mask process.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings:

FIG. 5A to 5G are views illustrating a method for forming a conducting polymer 4.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, the OLED display device and a method for fabricating the same according to embodiments of the present invention will be described in detail with reference to the annexed drawings.

Figure 1:
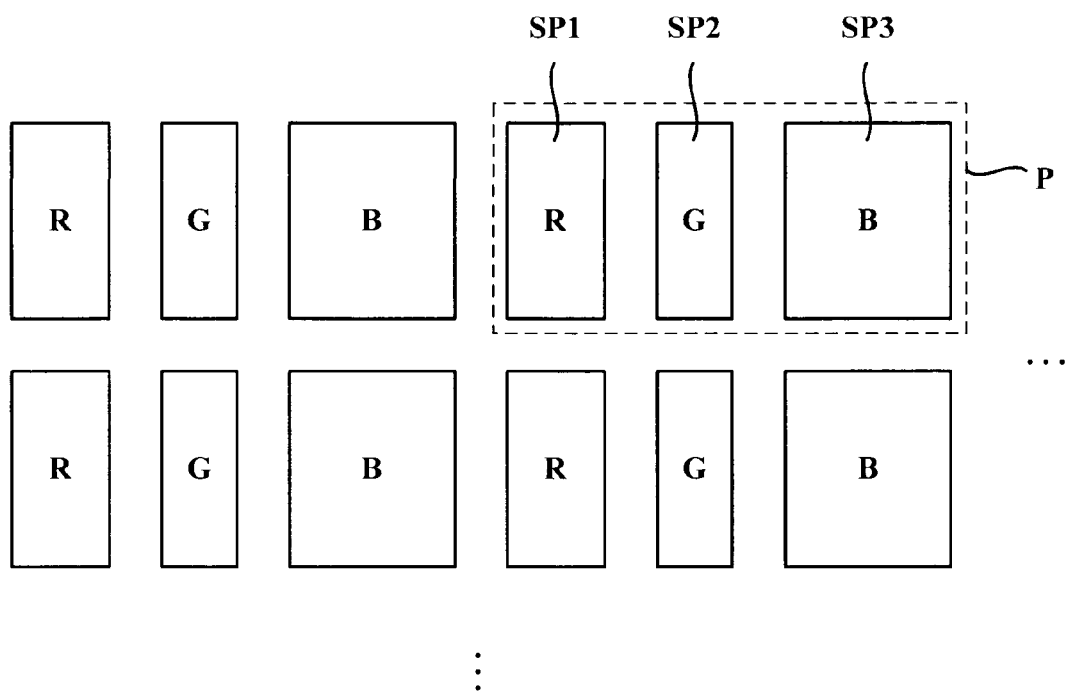
FIG. 1 is a plan view illustrating an OLED display device according to an embodiment of the present invention.
Figure 2:
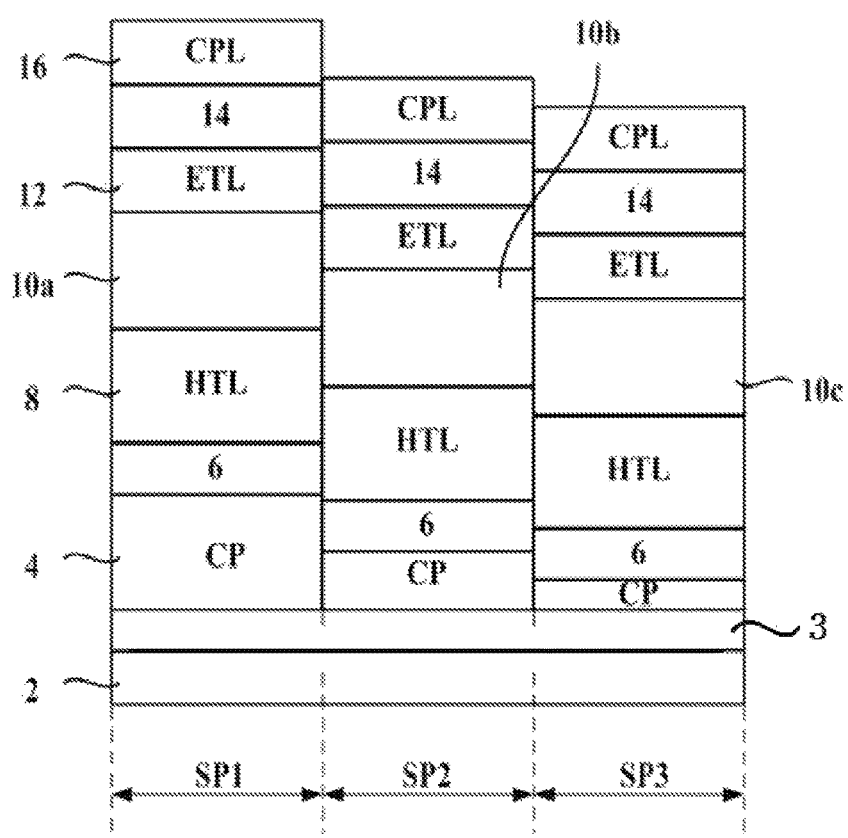
FIG. 2 is a sectional view illustrating RGB sub-pixels SP1, SP2 and SP3 shown in FIG. 1.
Figure 3:
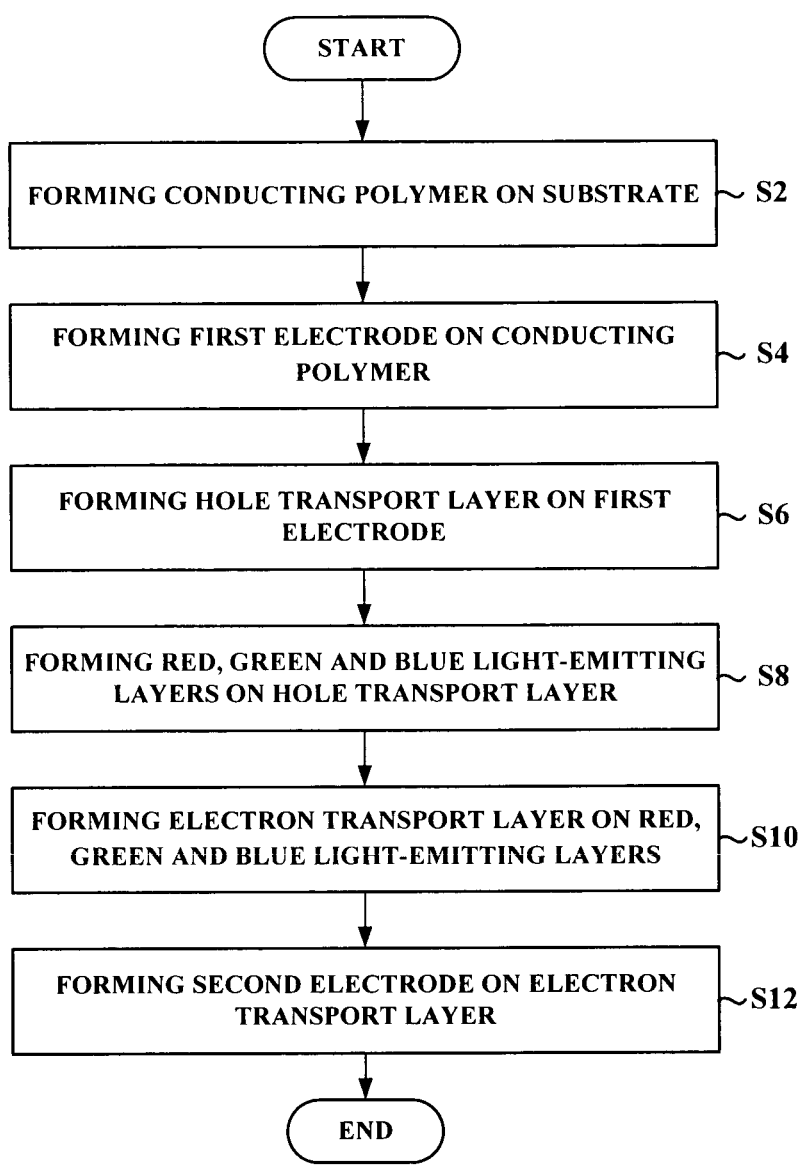
FIG. 3 is a flowchart illustrating a method for fabricating an OLED display device according to an embodiment of the present invention.

FIG. 1 is a plan view illustrating an OLED display device according to an embodiment of the present invention. FIG. 2 is a sectional view illustrating RGB sub-pixels SP1, SP2 and SP3 shown in FIG. 1. FIG. 3 is a flowchart illustrating a method for fabricating an OLED display device according to an embodiment of the present invention.

In the OLED display device shown in FIG. 1, RGB sub-pixels SP1, SP2 and SP3 to render red, green and blue colors are arranged. The RGB sub-pixels SP1, SP2 and SP3 may be arranged in a stripe shape, a quad shape or the like, and three sub-pixels SP1, SP2 and SP3 emitting red, green and blue rays constitute a unit pixel (P). FIG. 1 shows RGB sub-pixels SP1, SP2 and SP3 arranged in a stripe shape, but this configuration is provided as an example and the present invention is not limited to such configuration.

Hereinafter, cross-section structures and the fabrication method of the RGB sub-pixels SP1, SP2 and SP3 will be described.

Referring to FIGS. 2 and 3, the OLED display device of the present invention includes a conducting polymer 4, a first electrode 6, a hole transport layer 8, a plurality of light-emitting layers 10a, 10b and 10c, an electron transport layer 12, a second electrode 14 and a front sealing layer 16 laminated in this order on a substrate 2. The OLED display device is fabricated in the lamination order. Hereinafter, the present invention will be described in accordance with the lamination order.

Although not illustrated, the substrate 2 includes a thin film transistor to drive the RGB sub-pixels SP1, SP2 and SP3, gate lines and data lines to drive the thin film transistor, and a power line to supply power. The substrate 2 may be a glass substrate made of glass, a plastic substrate made of PET to implement a flexible display, or an ultra-thin glass substrate.

For reference, the OLED display device of the present invention is a top light-emission OLED display device. Accordingly, as shown in FIG. 2, a reflective layer 3 is further provided between the substrate 2 and the conducting polymer 4. The reflective layer 3 reflects light emitted toward the first electrode 6 from the light-emitting layers 10a, 10b and 10c, toward the second electrode 14. A thickness of a metal layer constituting the reflective layer is preferably 1,000 Å and a reflectivity of the reflective layer with respect to visible light, for example, light having a wavelength of 400 nm to 700 nm is preferably 92% or more.

A conducting polymer 4 is formed on the substrate 2 (on the reflective layer). The conducting polymer 4 implements a microcavity effect between the first electrode 6 as a non-transparent electrode and the second electrode 14 as a transparent electrode because it has different thicknesses in respective RGB sub-pixels SP1, SP2 and SP3. That is, the conducting polymer 4 controls interference between primary light emitted from the light-emitting layers 10a, 10b and 10c, and secondary light which is reflected or re-reflected, thereby improving brightness and color characteristics.

The present invention omits a conventional hole transport layer for controlling thickness to implement a microcavity effect and includes the conducting polymer 4 having different thickness in RGB sub-pixels SP1, SP2 and SP3 between the substrate 2 and the first electrode 6 to reduce fabrication costs and prevent a defect in which openings of shadow masks are clogged. Specifically, the present invention can reduce fabrication costs by omitting the conventional hole transport layer for thickness control which entails a high raw material cost or reducing the number of shadow mask processes. In addition, the conventional hole transport layer for thickness control causes a defect in which openings of shadow masks are clogged. On the other hand, the present invention can prevent the defect in which openings of shadow masks are clogged by omitting the conventional hole transport layer for thickness control. In addition, the conducting polymer 4 of the present invention is formed by a half-tone mask process which is easier and entails a lower cost than the shadow mask process, thus enabling cost reduction and easy fabrication.

Hereinafter, the method for fabricating the conducting polymer 4 of the present invention will be described in detail.

FIGS. 5A to 5G are sectional views illustrating the method for fabricating the conducting polymer 4.

Figure 5A:
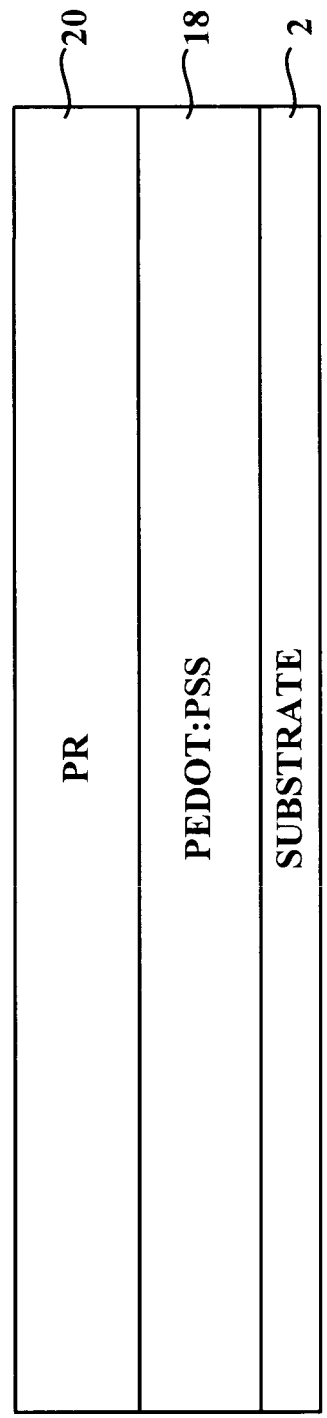

First, referring to FIG. 5A, a conductive polymer 18 (for example, PEDOT:PSS) which is a raw material for the conducting polymer 4 is formed on a substrate 2. In addition, a photoresist 20 is applied to the conductive polymer 18.

Then, referring to FIG. 5B, the substrate 2 to which the photoresist 20 has been applied is disposed such that the substrate 2 faces the mask substrate 28 each other. A blocking layer 22, the first semi-transmission layer 24 and the second semi-transmission layer 26 are formed to respectively correspond to the R sub-pixel SP1, the G sub-pixel SP2 and the B sub-pixel SP3 on the mask substrate 28. The first semi-transmission layer 24 has higher transmissivity than the second semi-transmission layer 26. In addition, the photoresist 20 formed on the substrate 2 is patterned using the blocking layer 22, and the first and second semi-transmission layers 24 and 26 formed on the mask substrate 28. As shown in FIG. 5C, the patterned photoresist 20 remains only in the RGB sub-pixels SP1, SP2 and SP3, and the RGB sub-pixels are, in decreasing order of thickness, the R sub-pixel SP1, the G sub-pixel SP2 and the B sub-pixel SP3.

Then, referring to FIG. 5D, the conducting polymer 18 is etched using the patterned photoresist 20 as a mask. Accordingly, the conductive polymer 18 remains only in the GB sub-pixels SP2 and SP3.

Then, referring to FIG. 5E, the pattern of the photoresist 20 corresponding to the B sub-pixel SP3 is removed through an ashing process and a portion of the conductive polymer 18 corresponding to the B sub-pixel SP3 is etched using the pattern of the photoresist 20 as a mask.

Then, referring to FIG. 5F, the pattern of the photoresist 20 corresponding to the G sub-pixel SP2 is removed through an ashing process or the like and a portion of the conductive polymer 18 corresponding to the G sub-pixel SP2 and the B sub-pixel SP3 is removed using the pattern of the photoresist 20 as a mask.

Then, the pattern of the photoresist 20 corresponding to the R sub-pixel SP1 is removed to form a conducting polymer 4 on the substrate 2, as shown in FIG. 5G.

Hereinafter, the conducting polymer 4 of the present invention will be described in more detail.

Figure 4:
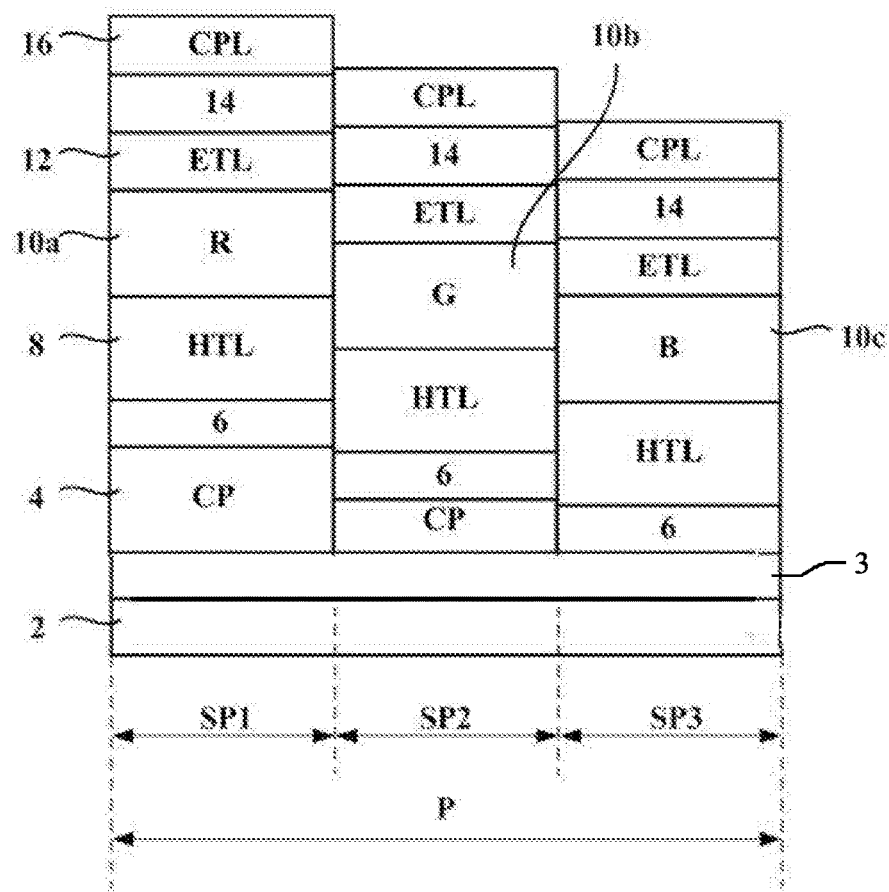
FIG. 4 is a sectional view illustrating RGB sub-pixels SP1, SP2 and SP3 according to another embodiment of the present invention.

The thickness of the conducting polymer 4 decreases in an order of the R sub-pixel SP1, the G sub-pixel SP2 and the B sub-pixel SP3, as shown in FIG. 2. This is determined in consideration of the difference in luminous efficacy between the red light-emitting layer 10a, the green light-emitting layer 10b and the blue light-emitting layer 10c provided respectively in the RGB sub-pixels SP1, SP2 and SP3, and aims at implementing microcavity effect through control of optical distance for improving optical efficacy. The conducting polymer 4 may be provided only in the R sub-pixel SP1 and the G sub-pixel SP2, as shown in FIG. 4. In this case, the thickness of the conducting polymer 4 decreases in an order of the R sub-pixel SP1 and the G sub-pixel SP2. The conducting polymer 4 preferably has a thickness of 20 nm to 200 nm, a refractive index of 1.5 to 2.0, and a transmittance of 90% or more in a visible light range.

Meanwhile, the conducting polymer 4 may be formed using a conductive polymer material.

For example, conducting polymer 4 may be formed using at least one material selected from a conductive plastic {(poly(3,4,-ethylene dioxythiophene):polystyrene sulfonic acid; PEDOT-PSS)}, polyacetylene, polyparaphenylene, polypyrrole and polyaniline. Preferably, the conducting polymer 4 is formed of a conductive plastic (PEDOT-PSS).

The first electrode 6 is an anode which is formed on the conducting polymer 4. The first electrode 6 may be formed of a transparent and electrically conductive material such as indium tin oxide (hereinafter, referred to as "ITO"), indium zinc oxide (hereinafter, referred to as "IZO").

The hole transport layer 8 is formed on the first electrode 6. The hole transport layer 8 supplies holes from the hole injection layer to the light-emitting layers 10a, 10b and 10c. The hole transport layer 8 is formed of a material having high hole mobility and thermal stability. For example, the hole transport layer 8 is formed using an aromatic amine compound having a rigid structure, or a material such as TPD (N,N'-diphenyl-N,N'-di(3-methylphenyl)-4,4'-diaminophenyl), NPD (N,N'-bis(1-naphthyl)-N,N'-diphenyl-1,1'-biphenyl-4,4'-diamine), TCTA (4-(9H-carbazol-9-yl)-N,N-bis[4-(9H-carbazol-9-yl)phenyl]-benzenamine), or CBP (4,4'-N,N'-dicarbazole-biphenyl). Preferably, the hole transport layer 8 is formed of NPD.

The light-emitting layers 10a, 10b and 10c are formed on the hole transport layer 8. The light-emitting layers 10a, 10b and 10c include a red light-emitting layer 10a emitting red light provided in each region corresponding to the R sub-pixel SP1, a green light-emitting layer 10b emitting green light provided in each region corresponding to the G sub-pixel SP2 and a blue light-emitting layer 10c emitting blue light provided in each region corresponding to the B sub-pixel SP3.

A host material of the red light-emitting layer 10a may be bis-(2-methyl)-8-quinolinolato derivative, and a dopant material thereof may be (biio)2Ir(acac) as an iridium complex. In this case, preferably, a thickness of the red light-emitting layer 10a may be set to 200 Å.

A host material of the green light-emitting layer 10b may be a N2-(9,9-dimethyl-9H-fluorne-2-yl)-9,10-(naphthalen-2-yl)anthracene derivative and a dopant material thereof may be 2,N2,N6,N6,9,10-hexaphenylanthracene-2,6-diamine. In this case, preferably, a thickness of the green light-emitting layer 10b may be set to 200 Å.

A host material of the blue light-emitting layer 10c may be a 9-naphthalen-2-yl-1-(naphthalen-3-yl)anthracene derivative and a dopant material thereof may be a pyrene derivative. In this case, preferably, a thickness of the blue light-emitting layer 10c may be set to 250 Å.

The electron transport layer 12 is formed on the light-emitting layers 10a, 10b and 10c. The electron transport layer 12 supplies electrons from the electron injection layer to the light-emitting layers 10a, 10b and 10. The electron transport layer 12 is formed of a material having high electron mobility and a lowest unoccupied molecular orbital (LUMO) level corresponding to a median value of the second electrode 14 and the light-emitting layers 10a, 10b and 10c. The electron transport layer 12 is formed of material such as Alq3, oxidiazole, triazole, phenathroline, imidazole, silole or MADN.

The second electrode 14 is a cathode which is formed on the electron transport layer 12. The second electrode 14 may be a monolayer structure formed of aluminum (Al) or silver (Ag), or may be a semi-transparent material having a multilayer structure formed by laminating aluminum (Al) or silver (Ag).

The front sealing layer 16 is formed on the second electrode 14. The front sealing layer 16 functions to block permeation of exterior moisture or oxygen and thereby improve reliability. For this purpose, the front sealing layer 16 has a structure in which one or more organic layers repeatedly alternate with one or more inorganic layers. The inorganic layer is formed of aluminum oxide ($Al_xO_x$), silicon oxide ($SiO_x$), $SiN_x$, SiON and LiF so as to primarily block permeation of exterior moisture or oxygen. In addition, the organic layer secondarily blocks permeation of exterior moisture or oxygen. In addition, the organic layer serves as a buffer layer which reduces stress between respective layers caused by the OLED display device and strengthens surface uniformity. The organic layer is formed of a resin such as an acrylic resin, an epoxy resin or a polyimide resin, or a polymer such as polyethylene.

TABLE 1

| Color | | Nit | X | Y |
| --- | --- | --- | --- | --- |
| R | Related art | 65.6 | 0.665 | 0.335 |
| | Present invention | 66.8 | 0.666 | 0.334 |
| G | Related art | 169.1 | 0.244 | 0.709 |
| | Present invention | 172.3 | 0.244 | 0.709 |
| B | Related art | 9.07 | 0.136 | 0.051 |
| | Present invention | 9.95 | 0.137 | 0.051 |

Table 1 compares the OLED display device according to the present invention with the OLED display device employing a conventional microcavity technology in terms of brightness and color characteristics.

As can be seen from Table 1, the OLED display device according to the present invention exhibits improved brightness and similar color characteristics, as compared to the OLED display device employing a conventional microcavity technology.

As described above, the present invention controls thicknesses of RGB sub-pixels to control interference between primary light emitted from the light-emitting layer and reflected or re-reflected secondary light and provide improved brightness and excellent color characteristics. In particular, the present invention omits a conventional hole transport layer for thickness control which entails a high fabrication cost to reduce fabrication costs and reduces the number of shadow mask processes to further reduce fabrication costs. In addition, omission of the hole transport layer for controlling thickness enables prevention the defect in which openings of shadow masks are clogged. In addition, a conducting polymer for controlling thickness may be formed by a half-tone mask process which is easier and entails a lower cost than the shadow mask process, thus enabling cost reduction and ease of fabrication.

As apparent from the fore-going, according to the present invention, it is possible to control interference between primary light emitted from the light-emitting layer and reflected or re-reflected secondary light and to provide improved brightness and excellent color characteristics through control of thicknesses of RGB sub-pixels. In particular, it is possible to reduce fabrication costs through omission of the conventional hole transport layer for thickness control, entailing a high raw material cost and to further reduce fabrication costs through reduction of the number of shadow mask processes. In addition, it is possible to prevent a defect in which openings of shadow masks are clogged through omission of the hole transport layer for controlling thickness. In addition, the conducting polymer for thickness control can be more easily fabricated at a low cost because it is formed by a half-tone mask process which is easier and entails a lower cost than the shadow mask process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An OLED display device comprising:
   first and second electrodes on a substrate;
   a red light-emitting layer, a green light-emitting layer and a blue light-emitting layer between the first and second electrodes;
   a hole transport layer between each of the red light-emitting layer, the green light-emitting layer and the blue light-emitting layer, and the first electrode;
   an electron transport layer formed between each of the red light-emitting layer, the green light-emitting layer and the blue light-emitting layer, and the second electrode;
   a reflective layer on a surface of the substrate; and
   a conducting polymer layer between the reflective layer and the first electrode,
   wherein the conducting polymer layer has a first thickness, a second thickness, and a third thickness in regions respectively corresponding to the red light-emitting layer, the green light-emitting layer and the blue light-emitting layer,
   wherein the first thickness, the second thickness, and the third thickness of the conducting polymer layer are each greater than zero and different from each other, and
   wherein the first thickness of the conducting polymer layer corresponds to the red light-emitting layer, the second thickness of the conducting polymer layer corresponds to the green light-emitting layer, and the third thickness of the conducting polymer layer corresponds to the blue light-emitting layer, and
   wherein the first thickness is greater than the second thickness, and the second thickness is greater than the third thickness.

2. The OLED display device according to claim 1, wherein the thickness of the conducting polymer layer is 20 nm to 200 nm.

3. The OLED display device according to claim 1, wherein the conducting polymer has a refractive index of 1.5 to 2.0 and a transmittance of 90% or more in a visible light region.

4. The OLED display device according to claim 1, wherein the conducting polymer layer is formed of a material selected from a conductive plastic (PEDOT-PSS), polyacetylene, polyparaphenylene, polypyrrole and polyaniline.

* * * * *